United States Patent
Haj-Maharsi et al.

(10) Patent No.: US 10,455,730 B2
(45) Date of Patent: Oct. 22, 2019

(54) THERMAL CONTROL SYSTEM

(71) Applicant: Saudi Arabian Oil Company, Dhahran (SA)

(72) Inventors: Mohamed Y. Haj-Maharsi, Dhahran (SA); Yasser A. Al-Howeish, Dhahran (SA)

(73) Assignee: Saudi Arabian Oil Company, Dharan (SA)

( * ) Notice: Subject to any disclaimer, the term of this patent is extended or adjusted under 35 U.S.C. 154(b) by 0 days.

(21) Appl. No.: 15/915,119

(22) Filed: Mar. 8, 2018

(65) Prior Publication Data

US 2019/0281728 A1  Sep. 12, 2019

(51) Int. Cl.
*H05K 7/20* (2006.01)

(52) U.S. Cl.
CPC ......... *H05K 7/20245* (2013.01); *H05K 7/202* (2013.01)

(58) Field of Classification Search
None
See application file for complete search history.

(56) References Cited

U.S. PATENT DOCUMENTS

| | | | |
|---|---|---|---|
| 4,043,305 A * | 8/1977 | Henault | F02D 21/08 123/698 |
| 4,441,328 A | 4/1984 | Brister | |
| 4,442,900 A | 4/1984 | Padilla et al. | |
| 4,744,698 A | 5/1988 | Dallimer et al. | |
| 5,002,130 A | 3/1991 | Laky | |
| 5,884,693 A | 3/1999 | Austin et al. | |
| 6,076,595 A | 6/2000 | Austin et al. | |
| 6,084,772 A | 7/2000 | Pell et al. | |
| 6,462,949 B1 | 10/2002 | Parish, IV et al. | |
| 7,227,749 B2 | 6/2007 | Rockenfeller | |

(Continued)

FOREIGN PATENT DOCUMENTS

| | | |
|---|---|---|
| BE | 1 015 842 A6 | 10/2005 |
| EP | 2487327 A1 | 8/2012 |

(Continued)

OTHER PUBLICATIONS

International Search Report for PCT/IB2018/056524, 4 pages (dated Dec. 13, 2018).

(Continued)

*Primary Examiner* — Courtney L Smith
(74) *Attorney, Agent, or Firm* — Choate, Hall & Stewart, LLP; Charles E. Lyon; Alexander Augst (57) ABSTRACT

An example system includes an enclosure housing electronics that generate heat. The enclosure includes a vent leading to an exterior of the enclosure. The vent is configured to allow the heat generated by the electronics to escape to the exterior. The enclosure includes an inlet configured to direct air into the enclosure. The vent and the inlet are arranged so that the heat escaping from the vent suctions the air through the inlet. The example system also includes a radiator having an input port and an output port. The input port is located exterior to the enclosure and the output port is connected to the inlet so that the air suctioned through the inlet causes air from the exterior to enter the radiator through the input port and to pass to the output port. The radiator is submerged, at least in part, in a coolant.

20 Claims, 4 Drawing Sheets

(56) References Cited

U.S. PATENT DOCUMENTS

| | | | |
|---|---|---|---|
| 7,234,524 B2 | 6/2007 | Shaw et al. | |
| 7,954,332 B2 | 6/2011 | Orlowski | |
| 8,542,006 B2 | 9/2013 | Liu | |
| 8,781,743 B2 | 7/2014 | McKay et al. | |
| 8,823,531 B1 | 9/2014 | McCleary et al. | |
| 9,203,218 B2 | 12/2015 | Boe | |
| 9,208,926 B2 | 12/2015 | Chartier | |
| 9,247,659 B1* | 1/2016 | Phillips | H05K 7/20827 |
| 9,330,583 B2 | 5/2016 | Cox et al. | |
| 9,351,424 B2 | 5/2016 | Facusse et al. | |
| 9,379,544 B2 | 6/2016 | Hazel et al. | |
| 9,392,733 B2 | 7/2016 | Day | |
| 9,397,486 B2 | 7/2016 | Hazel et al. | |
| 9,439,316 B2 | 9/2016 | Wijekoon et al. | |
| 9,471,116 B2 | 10/2016 | de Bock et al. | |
| 9,690,337 B1 | 6/2017 | Eichelberg et al. | |
| 9,742,163 B2 | 8/2017 | Aarskog et al. | |
| 9,752,404 B2 | 9/2017 | Aarskog | |
| 9,777,966 B2 | 10/2017 | Chan et al. | |
| 9,778,182 B2 | 10/2017 | Dolgopyatov et al. | |
| 9,780,482 B2 | 10/2017 | Lewin et al. | |
| 9,800,344 B2 | 10/2017 | Bjoerklund et al. | |
| 9,823,152 B2 | 11/2017 | Haldorsen et al. | |
| 2011/0254276 A1* | 10/2011 | Anderson, Jr. | F03B 17/061 290/54 |
| 2012/0211210 A1* | 8/2012 | Kidwell | C10L 3/10 165/184 |
| 2013/0068423 A1* | 3/2013 | Campbell | H05K 7/20136 165/104.14 |
| 2014/0267896 A1 | 9/2014 | Cox et al. | |
| 2014/0376900 A1 | 12/2014 | Bjerknes et al. | |
| 2015/0016812 A1 | 1/2015 | Radan et al. | |
| 2015/0131236 A1 | 5/2015 | Passmore et al. | |
| 2016/0053587 A1 | 2/2016 | Eriksen | |
| 2016/0150671 A1 | 5/2016 | Spindler et al. | |
| 2016/0181967 A1 | 6/2016 | Nojima | |
| 2016/0215913 A1 | 7/2016 | Knoener | |
| 2016/0239027 A1 | 8/2016 | Klingsheim | |
| 2017/0104329 A1 | 4/2017 | Boe | |
| 2017/0112021 A1* | 4/2017 | Gradinger | H05K 7/20236 |
| 2017/0126429 A1 | 5/2017 | Brekke et al. | |
| 2017/0156233 A1* | 6/2017 | Moss | H05K 7/20818 |
| 2017/0160017 A1 | 6/2017 | MacDonald | |
| 2017/0219284 A1* | 8/2017 | Plavnik | F26B 7/00 |
| 2017/0265328 A1* | 9/2017 | Sasaki | H05K 7/20236 |
| 2017/0280577 A1 | 9/2017 | Laneryd et al. | |
| 2018/0054916 A1* | 2/2018 | Kosugi | H05K 7/1497 |
| 2018/0156185 A1* | 6/2018 | Neu | F03B 3/10 |

FOREIGN PATENT DOCUMENTS

| | | |
|---|---|---|
| EP | 2988311 A1 | 2/2016 |
| WO | WO-93/05348 A1 | 3/1993 |
| WO | WO-2007/052899 A1 | 5/2007 |
| WO | WO-2009/011749 A1 | 1/2009 |
| WO | WO-2014/039064 A1 | 3/2014 |
| WO | WO-2015/058073 A1 | 4/2015 |
| WO | WO-2015/189093 A1 | 12/2015 |
| WO | WO-2016/173864 A1 | 11/2016 |
| WO | WO-2017/108210 A1 | 6/2017 |
| WO | WO-2017/133950 A1 | 8/2017 |

OTHER PUBLICATIONS

Written Opinion for PCT/IB2018/056524, 6 pages (dated Dec. 13, 2018).

* cited by examiner

THERMAL CONTROL SYSTEM

TECHNICAL FIELD

This specification describes example thermal control systems, such as convective cooling systems for cooling electronics devices.

BACKGROUND

Electronic devices generate heat during their operation. Excessive heat can affect the performance of electronic devices. For example, devices that are overheated may become inoperable. Cooling systems have therefore been developed to address problems resulting from electronics overheating.

SUMMARY

An example system includes an enclosure housing electronics that generate heat. The enclosure includes a vent leading to an exterior of the enclosure. The vent is configured to allow the heat generated by the electronics to escape to the exterior. The enclosure includes an inlet configured to direct air into the enclosure. The vent and the inlet are arranged so that the heat escaping from the vent suctions the air through the inlet. The example system also includes a radiator having an input port and an output port. The input port is located exterior to the enclosure and the output port is connected to the inlet so that the air suctioned through the inlet causes air from the exterior to enter the radiator through the input port and to pass to the output port. The radiator is submerged, at least in part, in a coolant. The example system may include one or more of the following features, either alone or in combination.

The enclosure may be located on a structure over a body of water. The coolant may be, or include, the water. The radiator may be submerged, at least in part, in the water. The enclosure may include an inner housing and an outer housing. The outer housing may at least partly enclose the inner housing. The inner housing may hold the electronics. The outer housing may include the vent and the inlet. The inner housing and the outer housing may be separated by a space through which the air passes to cool the electronics. At least one of the inner housing or the outer housing may be, or include, one or more walls that are at least partly corrugated. Suctioning of the air may be performed absent a pump to force the air into the radiator.

The example system may include one or more pumps to force at least some of the air into the radiator. The radiator may be a least partly helical. The vent may be located at a top surface of the enclosure and the inlet may be located closer to a bottom surface of the enclosure than to the top surface of the enclosure. The inlet may be located adjacent to the bottom surface of the enclosure. The air at the inlet may be at 20° Celsius or less.

An example method includes configuring a vent on an enclosure to allow heated air generated by electronics housed in the enclosure to escape through the vent to an exterior of the enclosure; configuring an inlet on the enclosure to allow the heated air escaping through the vent to suction cooled air through the inlet to an interior of the enclosure; and generating the cooled air using a radiator having an input port that is located in the exterior and an output port that is in fluid communication with the inlet. The suction created by the heated air escaping through vent draws air from the exterior into the radiator where the air is cooled to produce the cooled air. The example method may include one or more of the following features, either alone or in combination.

The enclosure may be located on a structure over a body of water. The radiator may be submerged, at least in part, in the water. The water may cool the air to produce the cooled air. The enclosure may be, or include, an inner housing and an outer housing. The outer housing may at least partly enclose the inner housing. The inner housing may hold the electronics. The outer housing may include the vent and the inlet. The inner housing and the outer housing may be separated by a space through which the cooled air passes to cool the electronics. At least one of the inner housing or the outer housing may include one or more walls that are at least partly corrugated.

Suctioning of the cooled air may be performed absent a pump to force the air into the radiator. The example method may include forcing at least some of the air from the exterior in to the radiator using a pump. The radiator may be a least partly helical. The vent may be located at a top surface of the enclosure and the inlet may be located closer to a bottom surface of the enclosure than to the top surface of the enclosure. The inlet may be located adjacent to the bottom surface of the enclosure. The cooled air at the inlet may be at 20° Celsius or less.

Any two or more of the features described in this specification, including in this summary section, can be combined to form implementations not specifically described in this specification.

The systems, techniques, and processes described in this specification, or portions of the systems, techniques, and processes, can be controlled using a computer program product that includes instructions that are stored on one or more non-transitory machine-readable storage media, and that are executable on one or more processing devices to control (for example, to coordinate) the operations described in this specification. The systems, techniques, and processes described in this specification, or portions of systems, techniques, and processes can thermally control an apparatus or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described in this specification are thermal control systems, examples of which include systems for cooling electronics using convection. An example cooling system includes an enclosure housing electronics that generate heat during operation. The enclosure includes a vent leading to an exterior of the enclosure. The vent is configured—for example, positioned on the enclosure—to allow the heat generated by the electronics to escape to the exterior. The enclosure also includes an inlet configured—for example, positioned on the enclosure—to direct air into the enclosure. The vent and the inlet are arranged so that the heat escaping from the vent suctions the air through the inlet to cool the electronics. A radiator is configured to cool the air that enters via the inlet. The radiator may include an input port and an output port. The input port is located exterior to the enclosure and the output port is connected to, and in fluid communication with, the inlet so that the air suctioned through the inlet causes air from the exterior to enter the radiator through its input port and to pass to its output port and, thus, to the inlet. The radiator is submerged, at least in part, in a coolant, such as seawater, which causes the air passing through the radiator to decrease in temperature.

Accordingly, in some implementations, the system is able to cool electronics, such as power electronics, using passive convection and absent forced convection that may be produced by active cooling devices, such as fans, blowers, air conditioning units, pumps, or the like. Passive cooling of this type may have advantages in that it does not rely on the operation of active cooling devices. Particularly in remote areas, such as an unpopulated offshore platform, failure of an active cooling device may not be detected for some time, which can result in overheating of onboard electronics. Selection of inadequate active cooling devices can produce a similar result.

In some implementations, the enclosure in which the electronics are housed includes both an inner housing and an outer housing. The inner housing holds the electronics and, in some examples, at least partly inhibits, at least partly reduces, or eliminates entirely, the flow of air over the electronics. The outer housing at least partly encloses the inner housing, and includes the vent and the inlet. The inner housing and the outer housing are separated by a space through which the air passes from the inlet to the vent to cool the inner housing and, thus, dissipate the heat radiated out of the inner housing by operation of the electronics. By inhibiting, reducing, or eliminating entirely, the flow of air over the electronics, the chances of damage to the electronics by dust or other particulate matter in the flow of air may be reduced. Thus, in some implementations, an example thermal control system provides cooling using a flow of air that does not actually touch the electronic devices.

Figure 1:
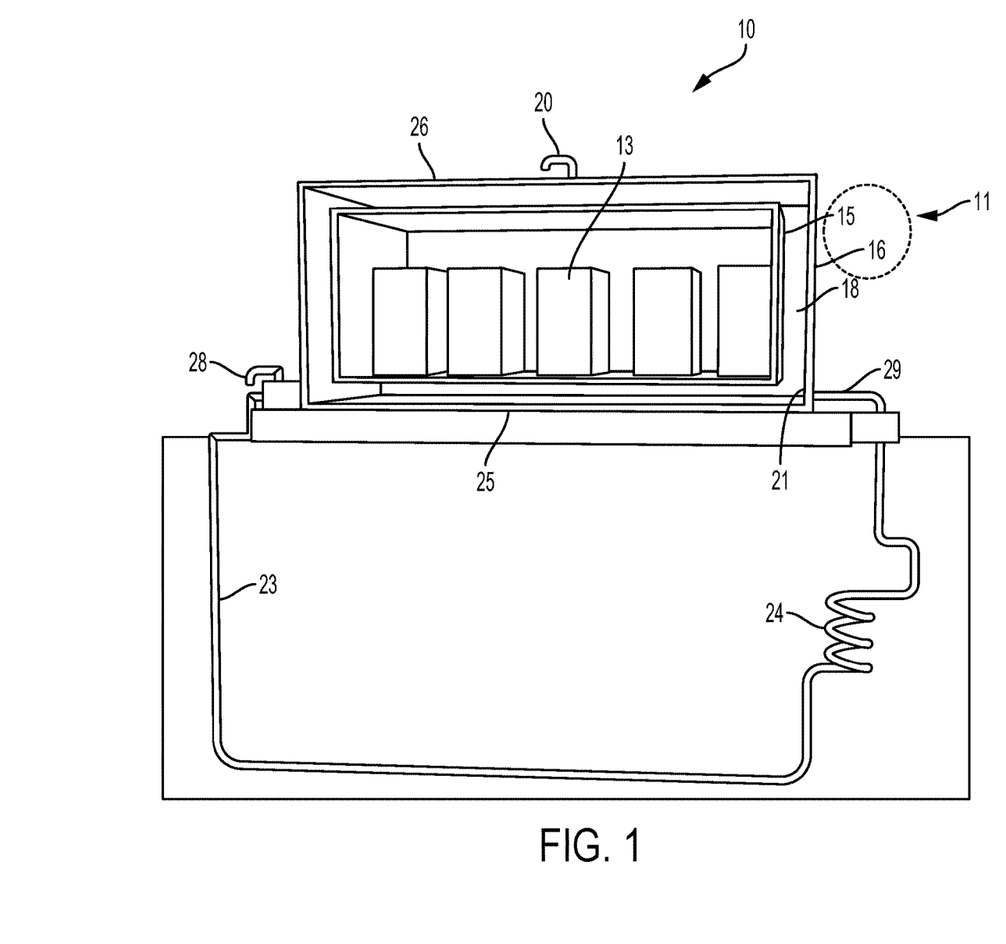
FIG. 1 is a cut-away, perspective view of a block diagram of components of an example convective cooling system for cooling electronics devices.

FIG. 1 shows an example implementation of a thermal control system, namely cooling system 10. Cooling system 10 is configured to use air convection to cool electronics, such as power electronics. Cooling system 10, however, is not limited to use with power electronics or to electronics in general, but rather may be used to cool, or otherwise to adjust the temperature of, any appropriate heat-producing entities, such as devices, materials, structures, lifeforms, or the like. In the example of FIG. 1, the electronics and the cooling system are located on an offshore platform and, therefore, are above seawater. Cooling system 10, however, is not limited to use on offshore platforms, and may be used in any appropriate environment.

Cooling system 10 includes enclosure 11. In this example, enclosure 11 houses power electronics 13. Examples of power electronics include, but are not limited to, solid state electronic devices that are configured to control the conversion and distribution of electric power. Power electronics 13 generate heat during operation, which may be dissipated using a cooling system described in this specification.

In this example, enclosure 11 includes inner housing 15 and outer housing 16. The dashed circle shown in FIG. 1 indicates that inner housing 15 and outer housing 16 are parts of enclosure 11 in this example. Inner housing 15 and outer housing 16 may be made of any appropriate materials, including metal, plastic, or the like. In some implementations, both inner housing 15 and outer housing 16 are made of a material or materials that have at least some thermal conductivity. For example, the inner housing and the outer housing may be made of a material containing copper, which is a metal that has a relatively high thermal conductivity. In some implementations, only the inner housing is made of a material or materials that have at least some thermal conductivity. As explained subsequently, heat generated by electronics within the inner housing conducts to a space 18 between the inner housing and the outer housing, and then evacuates via vent 20.

Inner housing 15 at least partly encloses the power electronics contained inside the inner housing. In some implementations, inner housing 15 may be air-tight, and completely enclose the power electronics contained inside the inner housing. For example, the inner housing may not allow air to enter into the interior of the inner housing and into contact with power electronics 13. This configuration may be advantageous in some environments, such as desert or desert-adjacent environments, where air flows can transport considerable amounts of dust or particulate matter that can interfere with operation of the electronics. In some implementations, inner housing 15 does not completely enclose the power electronics contained inside the inner housing. For example, the inner housing may contain holes, ports, or structural interruptions or configurations that allow air to enter into the interior of the inner housing and into contact with power electronics 13. This configuration may be advantageous in some environments, since direct contact between air and the electronics may cause relatively rapid changes in the temperature of the electronics.

In the example of FIG. 1, inner housing 15 completely encloses power electronics 13, and does not allow air to enter into the interior of the inner housing and into contact with power electronics 13. Heat generated within inner housing 15 dissipates, through conduction, to space 18 between inner housing 15 and outer housing 16. In some implementations, outer housing 16 may be air-tight except for an air inlet and an air outlet, and outer housing 16 may completely enclose inner housing 15. For example, the outer housing may not allow air to enter into space 18 between the inner housing and the outer housing, except for air passing from inlet 21 to vent 20. This configuration may be advantageous in that enables vacuum suction to be created within space 18 as a result of heated air leaving vent 20. As described subsequently, this vacuum suction enables creation of a self-sustaining passive cooling loop that includes vent 20, inlet 21, and radiator 23 in this example.

In this regard, enclosure 11 includes vent 20 and inlet 21. In the example of FIG. 1, heated air escapes space 18 through vent 20, and cooled air enters space 18 through inlet 21. "Heated" and "cooled" in this context do not have specific quantitative connotations, but rather represent relative temperatures only. For example, "heated" air is hotter than "cooled" air, and "cooled" air is colder than "heated" air. Heated air rises above cooled air. To enable cooled air to pass over a maximum, or increased, surface area of the inner housing, in some implementations, inlet 21 is located closer to a bottom surface 25 of the enclosure than to a top surface 26 of the enclosure, and vent 20 is located closer to the top surface of the enclosure than to the bottom surface of the enclosure. In some implementations, vent 20 may be located on top surface 26 of enclosure 11 or, more generally, at a location above inlet 21 relative to ground. In some implementations, inlet 21 may be located adjacent to, or on, bottom surface 25 of enclosure 11 or, more generally, at a location below vent 20 relative to ground.

Cooled air enters inlet 21 from radiator 23. Radiator 23 includes an input port 28 for receiving ambient air. The ambient air—which is typically at a higher temperature than the cooled air—passes through radiator 23, which cools the ambient air to produce the cooled air. To implement the cooling, the radiator is wholly, or at least partly, submerged in a coolant. In the example of FIG. 1, the coolant is seawater; however, any appropriate coolant may be used. As shown in FIG. 1, radiator 23 may be at least partially helical 24 in order to increase the distance that the air travels and thereby increase the time that the air is cooled. In some implementations, the radiator may be wholly, or a majority, helical, or have any other appropriate configuration to increase its length and the time that the air remains in the radiator and, thus, is subject to the coolant.

In operation, heated air (or simply, "heat") escaping from vent 20 creates a vacuum suction within space 18. That vacuum suction draws cooled air into space 18, from radiator 23, through inlet 21. The cooled air passes over inner housing 15, thereby extracting heat from the inner housing and cooling the inner housing and, thus, the electronics contained within the inner housing. The resulting heated air produced by the cooled air passing over inner housing 15 rises and escapes through vent 20, causing more vacuum suction and thus more cool air to be suctioned through inlet 21 into space 18. Meanwhile, vacuum suction created at inlet 21 as a result of suctioning cooled air into the enclosure propagates throughout the length of radiator 23, causing ambient air to be drawn into input port 28. This ambient air is cooled, as described previously, by coolant—seawater, in this example—and is output from radiator 23 at its output port 29, which is in fluid communication with inlet 21 of enclosure 11. In some implementations, so long as the air within space 18 remains hotter than the air entering through inlet 21, the cooling loop will continue operation unabated absent forced convention that may be produced by active cooling devices, such as fans, blowers, air conditioning units, HVAC (heating, ventilation, and air conditioning) systems, air pumps, or the like. Accordingly, cooling system 10 is self-sustaining in that it will continue operation for as long as needed to cool the electronics within enclosure 11, and will resume operation when the electronics cause the air in space 18 to be greater than the temperature of the incoming cooled air at inlet 21.

Thus, to summarize, air moves from inlet 21 to vent 20 using a passive natural flow of air caused by a temperature difference. In this example, the air flow passively cools the enclosure that houses the electronics absent the user of forced convection. The cooling may be implemented based on the difference of temperature between coolant, such as seawater, and the temperature of air within the enclosure. Near to the vent outlet of the enclosure, the air becomes hot because of the thermal energy dissipated by the electronics. The hot air circulating upwards creates a vacuum within the enclosure that suctions cold air through the inlet from the subsea radiator. Another vacuum is created at the input port to the subsea radiator resulting from that suction, which draws ambient air into the subsea radiator for cooling.

Figure 2:
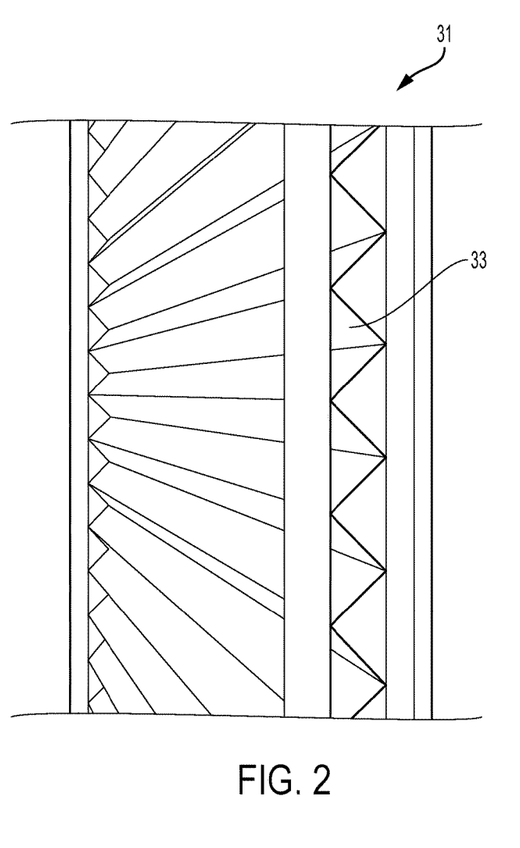
FIG. 2 is a cut-away, perspective, side-view of a part of a corrugated wall of a housing included in the example convective cooling system.

In some implementations, the walls of the inner housing may be corrugated—for example, zig-zagged—as shown FIG. 2. As shown, wall 31 is made of angled constituent pieces 33 This configuration may increase the thermally-radiative surface of the wall and, thereby, increase heat extraction by the cooling system. More specifically, the corrugation increases the surface area of the wall of the inner housing, thereby increasing the amount of the wall that is available to conduct heat. When air passes over the corrugated wall, the conducted heat is transferred to the air, which passes out through the vent. The additional surface area of the wall thus may be able to transfer more heat than a flat surface, and thereby speed or aid in the cooling process. In some implementations, one or more walls of the inner housing are at least partly corrugated. In some implementations, all walls of the inner housing are corrugated.

In some implementations, the walls of the inner housing are corrugated so as to form channels between the inner housing and the outer housing. The channels may be connected to form a single channel or multiple larger channels. Passing air through wall channels created by corrugation may increase the surface area impacted by the air and also increase the time that it takes for the air to flow from the inlet to the vent, thus leaving the air in contact with the inner housing longer, allowing for the air to absorb more heat from the inner housing, and to transport that heat out of the enclosure. Channels such as those described may also reduce a pressure of the air flow, thereby decreasing its speed and increasing potential cooling.

In some implementations, one or walls of the outer housing, such as its outer walls, are also at least partly corrugated. Increasing the surface area of the walls of the outer housing may, in some examples, further aid in heat dissipation, particularly in cooler climates where the exterior air temperature may be relatively low.

In some implementations, cooling system 10 may include one or more active devices, such as fans, blowers, air conditioning units, pumps, or the like, to inject air into input port 28. In some implementations, active devices of this type may assist or augment the passive cooling loop created in the prior description of FIG. 1.

In some implementations, enclosure 11 may omit inner housing 15, resulting in a single housing to hold the electronics. In implementations such as this, air may flow into direct contact with the electronics, as described previously. In some implementations, in cases where the inner housing is present, the inner housing may contain holes, ports, or structural interruptions or configurations that allow air to enter into the interior of the inner housing and into direct contact with power electronics 13.

In some implementations, the cooled air at inlet 21 may be at 20° Celsius or less; however, the cooling system is not limited to use with cooled air of this temperature. In some implementations, the ambient air may be at a lower temperature than the seawater containing the submerged radiator. In examples such as this, the cooling system will remain operable so long as the air at the inlet to the enclosure is at a lower temperature than the heated air being output through the vent.

Although a single vent and a single inlet are shown in FIG. 1, any appropriate number of vents and inlets may be used. Furthermore, although a single radiator is shown in FIG. 1, any appropriate number of radiators may be used. Although the example implementations have been described using air as the gaseous coolant, any appropriate gas or gases may be used in place of air.

Figure 3:
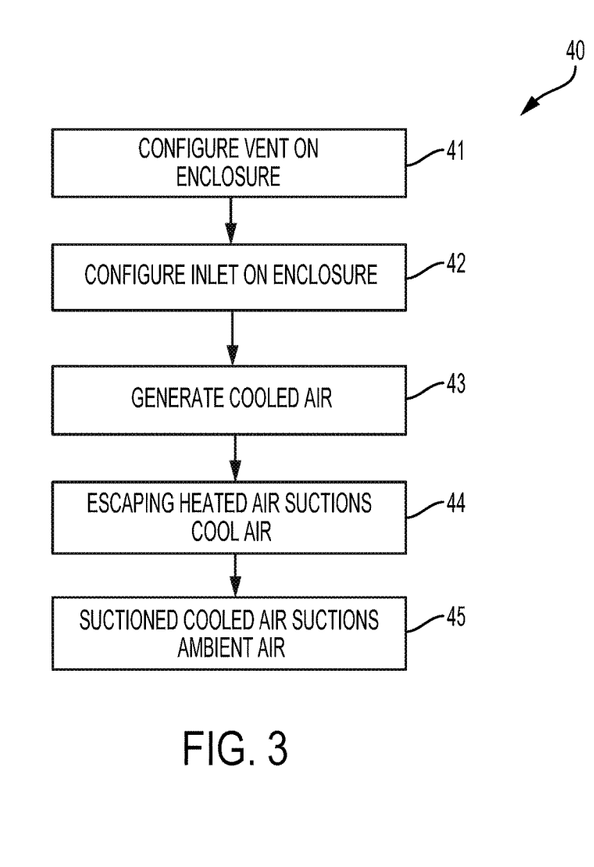
FIG. 3 is a flowchart showing examples of operations for configuring the example convective cooling system.

FIG. 3 shows an example process by which cooling system 10 may be operated. According to process 40, the vent is configured (41) and the inlet is configured (42). These elements may be configured upon installation of the system, and need not be done in the order shown. Cool air is generated (43) in radiator 23, as described previously. Escaping heated air from vent 20 suctions (44) the cooled air into the space between the inner and outer housings. This cools the inner housing, and thus the electronics contained within the inner housing, as described previously. The suctioned air causes ambient air to be suctioned (45) into the radiator. Process 40 may continue, automatically and unabated, while the electronics generate heat.

Figure 4:
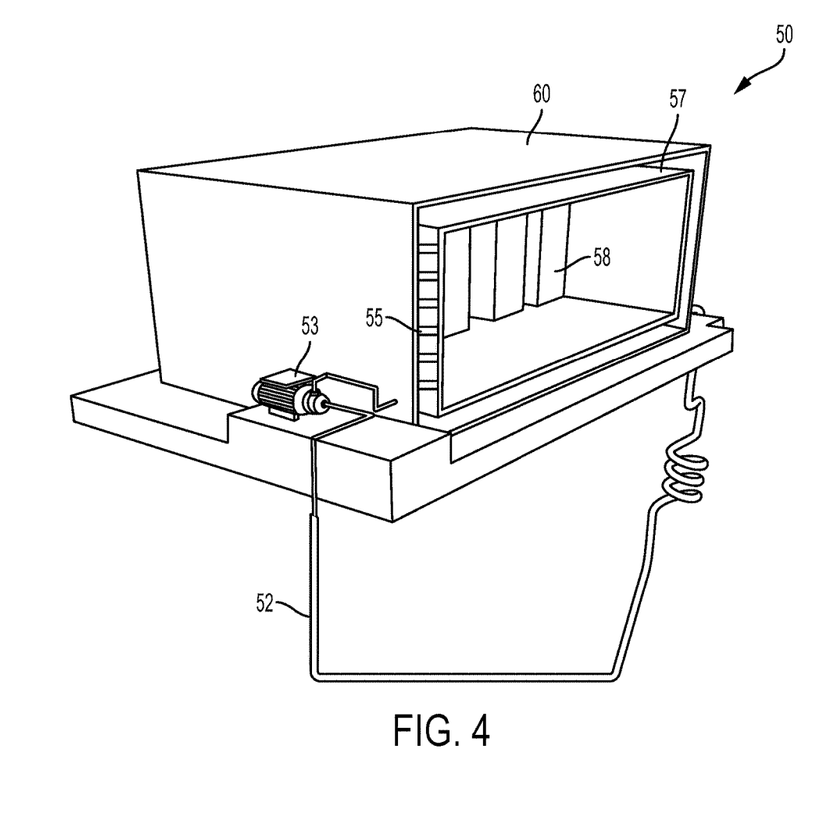
FIG. 4 is a cut-away, perspective view of a block diagram of components of an example conductive cooling system for cooling electronics devices.

In some implementations, the cooling system may be, or include, a closed-loop liquid cooling system 50 of the type shown in FIG. 4. In system 50, a liquid cooling agent is pumped through radiator 52 using one or more pumps 53 or other appropriate active liquid coolant injection mechanisms. The pumps may be computer-controlled to control the circulation of liquid coolant. The liquid cooling agent may be water, refrigerant, or any other appropriate liquid coolant.

In operation, one or more tubes 55, above, below, or around inner housing 56 conduct heat generated by electronics 58 housed in the inner housing. The heat causes the temperature of the coolant in the tubes to rise. The heated coolant is forced, through circulation, from the tubes and back towards, and to, the pump. From there, the heated coolant is forced into, and passes through, radiator 52 which, as described previously, may be submerged, at least partly in another liquid coolant (not shown), such as seawater. The seawater extracts heat from the liquid coolant within the radiator before that liquid coolant is forced, through action of pump 54, into the tubes within the enclosure. The resulting cooling loop cools the electronics through conduction. Although a single pump and radiator are shown in FIG. 4, any appropriate number of pumps and radiators may be used. Likewise, the system is not limited to use with seawater to extract heat from the liquid coolant; any appropriate agent may be used.

Although both an inner housing 57 and an outer housing 60 are shown in FIG. 4, system 50 may be implemented with only a single housing, such as inner housing 57.

In some implementations, the temperature of the electronics within the enclosure may be monitored using a local computer system, and reported back to a remote computer system at appropriate time intervals. In some implementations, the temperature of the electronics within the enclosure may be monitored using a local computer system, and used to control the operation of pump 53.

Any features of the implementation shown in FIG. 4 may be combined with features of the implementation shown in FIG. 1, as appropriate. For example, a single enclosure may include both a passive convective cooling system of the type shown in FIG. 1, and a closed-loop conductive cooling system of the type shown in FIG. 4. In an example, the passive convective cooling system may operate automatically as a back-up cooling system in the event that the closed-loop conductive cooling system fails.

The example cooling systems described in this specification may be implemented in conjunction with, or used to control the temperature of, or both, one or more computing systems. In an example, a computing system may include various controllers, processing devices, or both to monitor cooling system operation or to control one or more cooling system elements. A central computer may coordinate operation among the various controllers or processing devices. The central computer, controllers, and processing devices may execute various software routines to effect control and coordination of the various automated elements. The example cooling systems described in this specification may be used to control the temperature of these devices.

The cooling systems described in this specification can be monitored, controlled, or both using one or more computer program products, such as one or more computer program tangibly embodied in one or more information carriers, such as one or more non-transitory machine-readable media, for execution by, or to control the operation of, one or more data processing apparatus, such as a programmable processor, a computer, multiple computers, or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with monitoring, thermal control, or both can be performed by one or more programmable processors executing one or more computer. Actions associated with monitoring, thermal control, or both can be implemented using special purpose logic circuitry, such as an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Machine-readable storage media suitable for embodying computer program instructions and data include all forms of non-volatile storage area, including by way of example, semiconductor storage area devices, such as EPROM, EEPROM, and flash storage area devices; magnetic disks, for example, internal hard disks or removable disks; magneto-optical disks; and CD-ROM and DVD-ROM disks.

The example cooling systems described in this specification may be used to control the temperature of the example devices described in the preceding paragraphs, of power electronics, and of other entities not specifically described in this specification.

Elements of different implementations described in this specification may be combined to form other implementations not specifically set forth above. Elements may be left out of the structures described in this specification without adversely affecting their operation. Furthermore, various separate elements may be combined into one or more individual elements to perform the functions described in this specification.

What is claimed is:

1. A system comprising:
an enclosure housing electronics that generate heat, the enclosure comprising a vent leading to an exterior of the enclosure, the vent being configured to allow the heat generated by the electronics to escape to the exterior, the enclosure comprising an inlet configured to direct air into the enclosure, the vent and the inlet being arranged so that the heat escaping from the vent produces a vacuum that suctions the air through the inlet; and
a radiator comprising an input port and an output port, the input port being located exterior to the enclosure and the output port being connected to the inlet so that the air suctioned through the inlet causes air from the exterior to enter the radiator through the input port and to pass to the output port, the radiator being submerged, at least in part, in a coolant.

2. The system of claim 1, where the enclosure is located on a structure over water, the coolant comprising the water; and
where the radiator is submerged, at least in part, in the water.

3. The system of claim 1, where the enclosure comprises an inner housing and an outer housing, the outer housing at least partly enclosing the inner housing, the inner housing holding the electronics, the outer housing comprising the vent and the inlet, the inner housing and the outer housing being separated by a space through which the air passes to cool the electronics.

4. The system of claim 3, where at least one of the inner housing or the outer housing comprises one or more walls that are at least partly corrugated.

5. The system of claim 1, where the air is suctioned absent a pump.

6. The system of claim 1, further comprising:
one or more pumps to force at least some of the air into the radiator.

7. The system of claim 1, where the radiator is a least partly helical.

8. The system of claim 1, where the vent is located at a top surface of the enclosure and the inlet is located closer to a bottom surface of the enclosure than to the top surface of the enclosure.

9. The system of claim 8, where the inlet is located adjacent to the bottom surface of the enclosure.

10. The system of claim 1, where the air at the inlet is 20° Celsius or less.

11. A method comprising:
configuring a vent on an enclosure to allow heated air generated by electronics housed in the enclosure to escape through the vent to an exterior of the enclosure;
configuring an inlet on the enclosure to allow the heated air escaping through the vent to suction cooled air through the inlet to an interior of the enclosure; and
generating the cooled air using a radiator having an input port that is located in the exterior and an output port that is in fluid communication with the inlet, the suction created by the heated air escaping through vent drawing air from the exterior into the radiator where the air is cooled to produce the cooled air.

12. The method of claim 11, where the enclosure is located on a structure over a body of water; and
where the radiator is submerged, at least in part, in the water, the water cooling the air to produce the cooled air.

13. The method of claim 11, where the enclosure comprises an inner housing and an outer housing, the outer housing at least partly enclosing the inner housing, the inner housing holding the electronics, the outer housing comprising the vent and the inlet, the inner housing and the outer housing being separated by a space through which the cooled air passes to cool the electronics.

14. The method of claim 13, where at least one of the inner housing or the outer housing comprises one or more walls that are at least partly corrugated.

15. The method of claim 11, where the cooled air is suctioned absent a pump.

16. The method of claim 11, further comprising:
forcing at least some of the air from the exterior in to the radiator using a pump.

17. The method of claim 11, where the radiator is a least partly helical.

18. The method of claim 11, where the vent is located at a top surface of the enclosure and the inlet is located closer to a bottom surface of the enclosure than to the top surface of the enclosure.

19. The method of claim 18, where the inlet is located adjacent to the bottom surface of the enclosure.

20. The method of claim 11, where the cooled air at the inlet is 20° Celsius or less.

* * * * *

UNITED STATES PATENT AND TRADEMARK OFFICE
CERTIFICATE OF CORRECTION

PATENT NO. : 10,455,730 B2
APPLICATION NO. : 15/915119
DATED : October 22, 2019
INVENTOR(S) : Mohamed Y. Haj-Maharsi and Yasser A. Al-Howeish Page 1 of 1

It is certified that error appears in the above-identified patent and that said Letters Patent is hereby corrected as shown below:

In the Claims

In Claim 11, Column 10, Line 13, please insert --the-- between "escaping through" and "vent drawing".

In Claim 17, Column 10, Line 36, please replace --"is a least"-- with "is at least".

Signed and Sealed this
Thirty-first Day of December, 2019

Andrei Iancu
*Director of the United States Patent and Trademark Office*